(12) United States Patent
Ushioda et al.

(10) Patent No.: US 10,890,630 B2
(45) Date of Patent: Jan. 12, 2021

(54) MAGNETIC SENSOR

(71) Applicant: TDK CORPORATION, Tokyo (JP)

(72) Inventors: Kentaro Ushioda, Tokyo (JP); Makoto Kameno, Tokyo (JP); Chengbin Lin, Tokyo (JP); Shuichi Okawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 65 days.

(21) Appl. No.: 16/302,264

(22) PCT Filed: May 22, 2017

(86) PCT No.: PCT/JP2017/019009
§ 371 (c)(1),
(2) Date: Nov. 16, 2018

(87) PCT Pub. No.: WO2017/204151
PCT Pub. Date: Nov. 30, 2017

(65) Prior Publication Data
US 2019/0293735 A1    Sep. 26, 2019

(30) Foreign Application Priority Data

May 24, 2016 (JP) ................................. 2016-103210

(51) Int. Cl.
*G01R 33/09* (2006.01)
*H01L 43/08* (2006.01)
*G01R 33/02* (2006.01)

(52) U.S. Cl.
CPC ........... *G01R 33/093* (2013.01); *G01R 33/02* (2013.01); *G01R 33/09* (2013.01); *H01L 43/08* (2013.01)

(58) Field of Classification Search
None
See application file for complete search history.

(56) References Cited

U.S. PATENT DOCUMENTS 5,696,447 A * 12/1997 Coutellier .............. G01R 33/09
324/252
8,451,003 B2 * 5/2013 Yamazaki ............ G01R 33/091
324/252
(Continued)

FOREIGN PATENT DOCUMENTS

JP   H07210835 A   8/1995
JP   H095413 A    1/1997
(Continued)

OTHER PUBLICATIONS

English language translation of International Preliminary Report on Patentability in PCT/JP2017/019009 dated Aug. 1, 2017.

*Primary Examiner* — Jermele M Hollington
(74) *Attorney, Agent, or Firm* — Young Law Firm, P.C.

(57) ABSTRACT

An object of the present invention is to enhance detection accuracy of a magnetic sensor having four bridge-connected magnetic sensing elements. A magnetic sensor includes magnetic layers 41-43 provided on a surface of the sensor substrate 20 and bridge-connected magnetic sensing elements R1-R4. The magnetic layer 41 includes a main area M1 and a converging area S1 having a width gradually reduced with increasing distance from the main area M1, the magnetic layer 42 includes a main area M2 and converging areas S5, S7 each having a width gradually reduced with increasing distance from the main area M2, and the magnetic layer 43 includes a main area M3 and converging areas S6, S8 each having a width gradually reduced with increasing distance from the main area M3. The end portions of the converging areas S1-S4 and the end portions of the converging areas S5-S8 face each other, respectively, through gaps G1-G4, respectively. The magnetic sensing elements R1-R4 are disposed on magnetic paths formed by the gaps G1-G4, respectively. According to the present invention, detection accuracy is enhanced because a magnetic flux (Continued)

generated by current flowing in one magnetic sensing element does not affect the other sensing element.

20 Claims, 16 Drawing Sheets

(56) References Cited

U.S. PATENT DOCUMENTS

| | | | | |
|---|---|---|---|---|
| 9,791,341 B2* | 10/2017 | Fuji | ............................ | G01L 9/16 |
| 10,145,751 B2* | 12/2018 | Fuji | ............................ | H04R 1/46 |
| 2009/0284254 A1 | 11/2009 | Kasajima | | |
| 2010/0156405 A1 | 6/2010 | Furukawa et al. | | |
| 2011/0215800 A1* | 9/2011 | Zhou | ....................... | B82Y 25/00 |
| | | | | 324/252 |
| 2013/0134969 A1* | 5/2013 | Ohta | ..................... | G01R 33/093 |
| | | | | 324/252 |
| 2013/0255393 A1* | 10/2013 | Fukuzawa | ................. | G01L 9/16 |
| | | | | 73/779 |
| 2015/0028863 A1* | 1/2015 | Zeyen | ................. | G01R 33/0011 |
| | | | | 324/244 |
| 2015/0082886 A1* | 3/2015 | Fukuzawa | ............. | G01P 15/105 |
| | | | | 73/514.31 |
| 2015/0331072 A1* | 11/2015 | Ogawa | .................... | G01R 33/09 |
| | | | | 324/252 |
| 2020/0209327 A1* | 7/2020 | Takahashi | .......... | G01R 33/0094 |
| 2020/0241052 A1* | 7/2020 | Kubota | ................. | G01R 15/205 |
| 2020/0256934 A1* | 8/2020 | Saruki | .................. | G01R 33/022 |

FOREIGN PATENT DOCUMENTS

| | | |
|---|---|---|
| JP | 2008-170368 A | 7/2008 |
| JP | 5500785 B2 | 3/2012 |
| JP | 4964301 B2 | 4/2012 |
| JP | 2012-93342 A | 5/2012 |
| JP | 2013-108923 A | 6/2013 |
| JP | 2015219061 A | 12/2015 |
| WO | 2005013376 A1 | 2/2005 |

* cited by examiner

MAGNETIC SENSOR

TECHNICAL FIELD

The present invention relates to a magnetic sensor and, more particularly, to a magnetic sensor having four bridge-connected magnetic sensing elements.

BACKGROUND ART

Magnetic sensors using a magnetic sensing element are widely used in an ammeter, a magnetic encoder, and the like. As described in Patent Document 1, magnetic sensors can be provided with an external magnetic member for collecting magnetic flux to a magnetic sensing element. However, in a magnetic sensor described in Patent Document 1, magnetic flux to be detected is not sufficiently concentrated on the magnetic sensing element, so that it is difficult to enhance detection accuracy.

On the other hand, a magnetic sensor described in Patent Document 2 has a magnetic layer on a sensor substrate on which the magnetic sensing element is formed, and magnetic flux to be detected is concentrated on the magnetic sensing element by the magnetic layer. In the magnetic sensor described in Patent Document 2, three magnetic layers are used to form two gaps, and two magnetic sensing elements are disposed in each of the two gaps to constitute a bridge circuit by four magnetic sensing elements in total.

CITATION LIST

Patent Document

[Patent Document 1] Japanese Patent No. 5,500,785
[Patent Document 2] Japanese Patent No. 4,964,301

SUMMARY OF INVENTION

Technical Problem to be Solved by Invention

However, in the magnetic sensor described in Patent Document 2, the number of the gaps formed by the magnetic layers is two, so that two magnetic sensing elements constituting the bridge circuit are disposed in the same gap. When a current flowing in one of the two magnetic sensing elements is reduced, a current flowing in the other one thereof is increased, so that magnetic flux generated by the current flowing in one magnetic sensing element has a non-negligible influence on the other magnetic sensing element, which may deteriorate detection accuracy.

It is therefore an object of the present invention to provide an improved magnetic sensor having four bridge-connected magnetic sensing elements.

Means for Solving Problem

A magnetic sensor according to the present invention includes: a sensor substrate; first, second, and third magnetic layers provided on the sensor substrate; and bridge-connected first, second, third, and fourth magnetic sensing elements. The first magnetic layer includes a first main area and first, second, third, and fourth converging areas each having a width gradually reduced with increasing distance from the first main area. The second magnetic layer includes a second main area and fifth and seventh converging areas each having a width gradually reduced with increasing distance from the second main area. The third magnetic layer includes a third main area and sixth and eighth converging areas each having a width gradually reduced with increasing distance from the third main area. The end portions of the first, second, third, and fourth converging areas and the end portions of the fifth, sixth, seventh, and eighth converging areas face each other, respectively, through first, second, third, and fourth gaps, respectively. The first, second, third, and fourth magnetic sensing elements are disposed on magnetic paths formed by the first, second, third, and fourth gaps, respectively.

According to the present invention, the four magnetic sensing elements are disposed on the magnetic paths formed by the mutually different gaps, thus preventing magnetic flux generated by current flowing in one magnetic sensing element from affecting the other sensing element. Thus, it is possible to provide a magnetic sensor with higher detection accuracy.

The magnetic sensor according to the present invention preferably further includes a first external magnetic member provided on the sensor substrate so as to cover the first main area. This can enhance selectivity of magnetic flux in a direction perpendicular to the sensor substrate.

In this case, the width of the first external magnetic member in a first direction that is the extending direction of the first to fourth gaps is preferably larger than the width of the first main area in the first direction, whereby the entire width of the first main area in the first direction is preferably covered with the first external magnetic member. This can suppress deterioration in detection accuracy attributable to displacement of the first external magnetic member.

The magnetic sensor according to the present invention preferably further includes a second external magnetic member provided near the second main area and a third external magnetic member provided near the third main area. This allows achievement of higher detection accuracy.

In the present invention, the first converging area and the fourth converging area are preferably line-symmetric with respect to a first line extending in the first direction that is the extending direction of the first to fourth gaps, and the second converging area and the third converging area are preferably line-symmetric with respect to the first line. This enhances the balance of the magnetic flux to be applied to the first and fourth magnetic sensing elements and the balance of the magnetic flux to be applied to the second and third magnetic sensing elements, allowing achievement of higher detection accuracy.

In the present invention, the first converging area and the third converging area are preferably line-symmetric with respect to a second line extending in a second direction perpendicular to the extending direction of the first to fourth gaps, the second converging area and the fourth converging area are preferably line-symmetric with respect to the second line, the fifth converging area and the seventh converging area are preferably line-symmetric with respect to the second line, and the sixth converging area and the eighth converging area are preferably line-symmetric with respect to the second line. This enhances the balance of the magnetic flux to be applied to the first and third magnetic sensing elements and the balance of the magnetic flux to be applied to the second and fourth magnetic sensing elements, allowing achievement of higher detection accuracy.

In the present invention, the first and third magnetic sensing elements may each overlap the first and second magnetic layers, and the second and fourth magnetic sensing elements may each overlap the first and third magnetic layers. This reduces leakage magnetic flux, allowing achievement of higher detection accuracy.

In the present invention, a cut part having a loop-shaped outer periphery is preferably formed in the first magnetic layer. With this configuration, residual magnetic flux of the first magnetic layer circulates around the outer periphery of the cut part, thus making it possible to prevent deterioration in detection accuracy due to the residual magnetic flux.

In the present invention, the first, second, third, and fourth magnetic sensing elements may each be constituted by a plurality of series-connected magnetic sensing elements disposed on the magnetic path formed by each of the first, second, third, and fourth gaps. This allows achievement of higher detection accuracy.

In this case, the magnetic sensor according to the present invention preferably further includes fourth magnetic layers disposed, in a plan view, between the plurality of magnetic sensing elements constituting each of the first, second, third, and fourth sensing elements. This can reduce leakage magnetic flux from between the plurality of magnetic sensing elements. Further, in this case, the fourth magnetic layer may overlap the plurality of magnetic sensing elements constituting each of the first, second, third, and fourth sensing elements. This can further reduce the leakage magnetic flux from between the plurality of magnetic sensing elements. Further, the fourth magnetic layers may be divided in the first direction that is the extending direction of the first to fourth gaps. With this configuration, the fourth magnetic layers have magnetic anisotropy, allowing achievement of higher detection accuracy.

In the present invention, the first to fourth magnetic sensing elements are each preferably a magnetoresistive element. In this case, the sensitivity directions of the magnetoresistive elements constituting the respective first to fourth magnetic sensing elements are preferably the same, and the magnetoresistive elements constituting the respective first to fourth magnetic sensing elements are each preferably a spin valve type GMR element.

Advantageous Effects of the Invention

In the present invention, the four magnetic sensing elements are disposed on the magnetic paths formed by mutually different gaps, so that it is possible to obtain a magnetic sensor with high detection accuracy by bridge-connecting the four magnetic sensing elements.

MODE FOR CARRYING OUT THE INVENTION

Preferred embodiments of the present invention will now be explained in detail with reference to the drawings.

Figure 1:
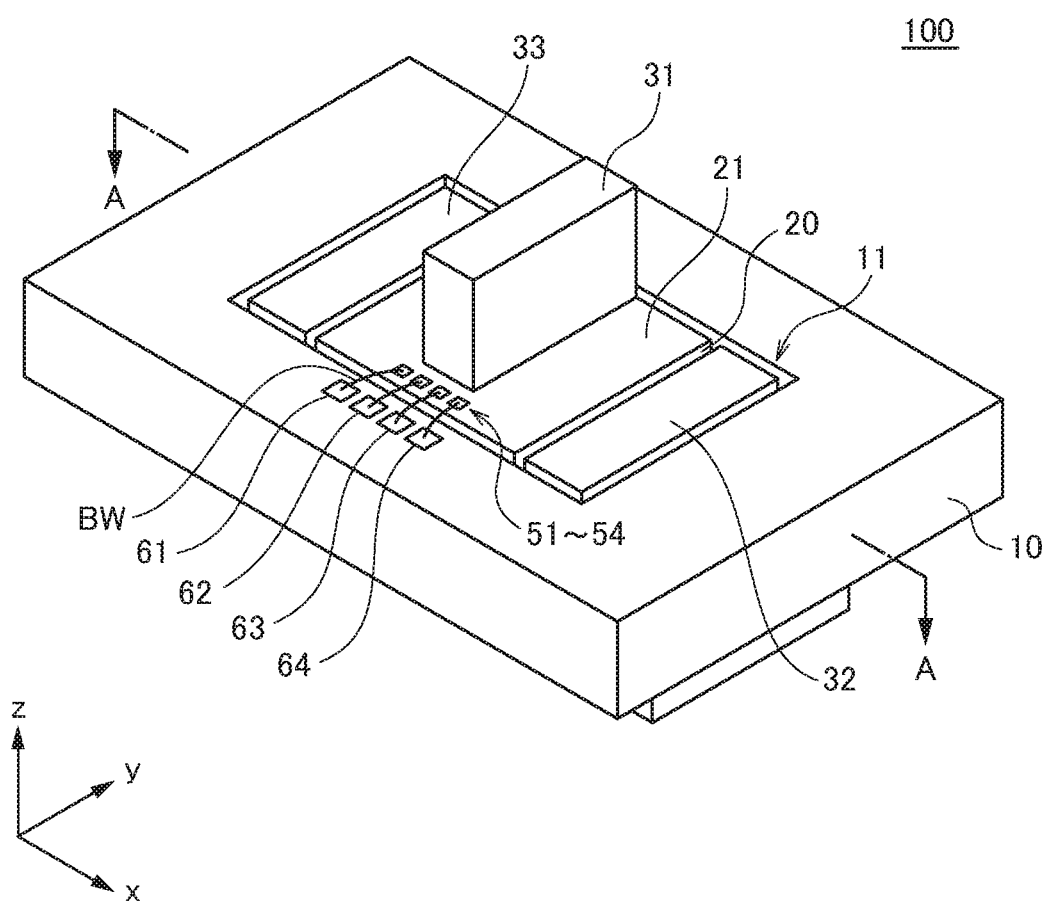
FIG. 1 is a schematic perspective view illustrating the outer appearance of a magnetic sensor 100 according to a preferred embodiment of the present invention.
Figure 2:
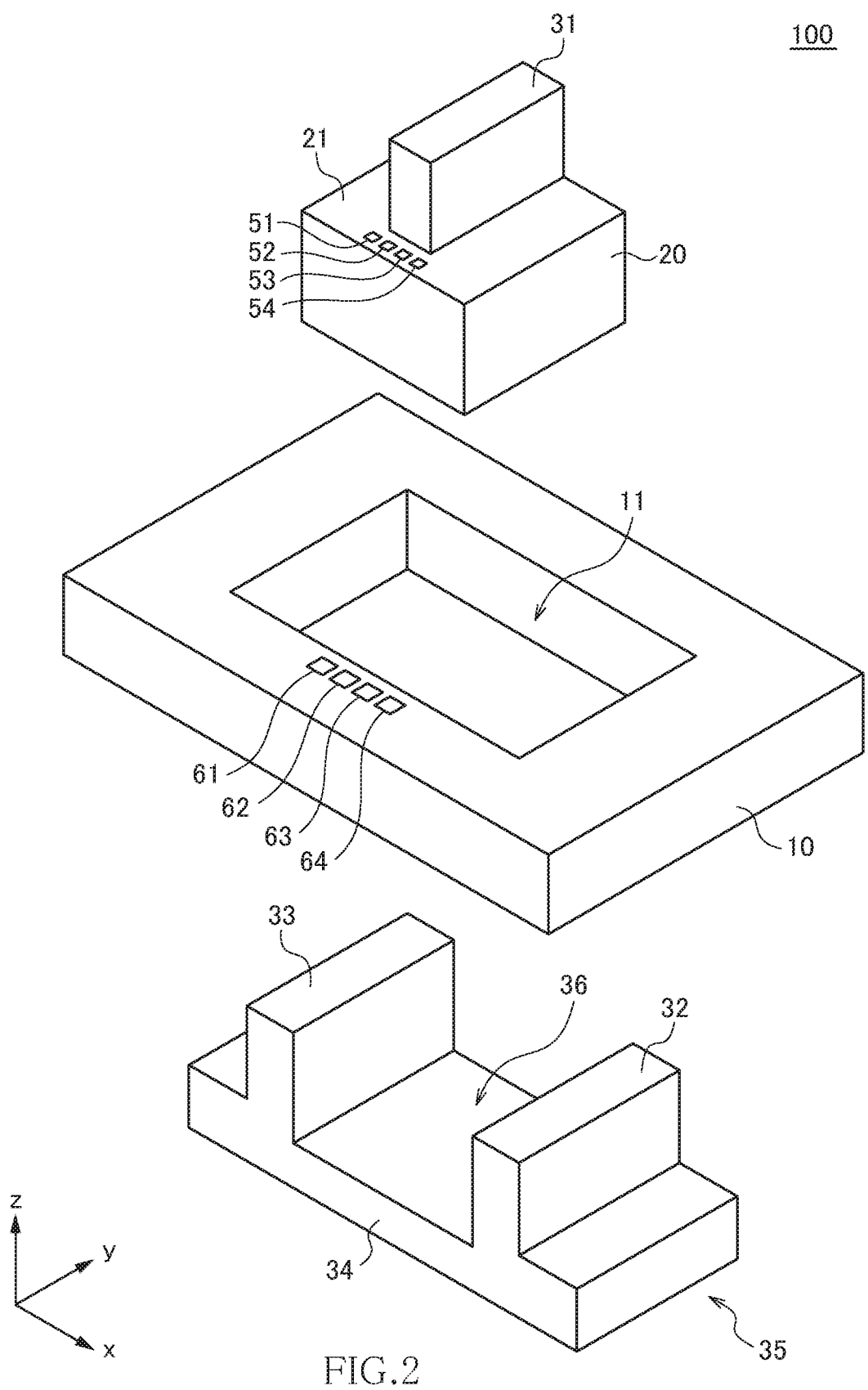
FIG. 2 is a schematic exploded perspective view of the magnetic sensor 100.

FIG. 1 is a schematic perspective view illustrating the outer appearance of a magnetic sensor 100 according to a preferred embodiment of the present invention. FIG. 2 is a schematic exploded perspective view of the magnetic sensor 100, and FIG. 3 is a schematic cross-sectional view taken along line A-A in FIG. 1.

Figure 3:
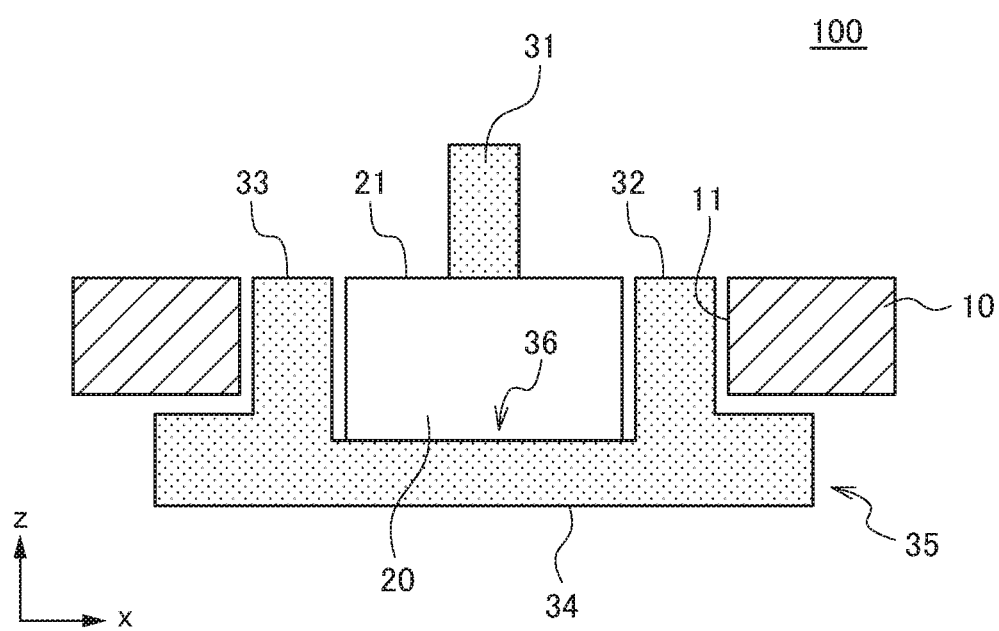
FIG. 3 is a schematic cross-sectional view taken along line A-A in FIG. 1.

As illustrated in FIGS. 1 to 3, the magnetic sensor 100 according to the present embodiment includes a circuit board 10 having an opening 11, a sensor substrate 20 disposed in the opening 11, and first to fourth external magnetic members 31 to 34 fixed to the sensor substrate 20. The sensor substrate 20 is a chip component smaller in size than the circuit board 10 and has a magnetic sensing element to be described later. The first to fourth external magnetic members 31 to 34 are each a block made of a soft magnetic material having high permeability, such as ferrite.

The sensor substrate 20 has a substantially rectangular parallelepiped shape, and the first external magnetic member 31 is disposed on an element forming surface 21 constituting the xy plane. The sensor substrate 20 is generally produced by forming a number of the sensor substrates 20 as an aggregate substrate and then separating one from the other as the individual sensor substrates 20. However, the present invention is not limited to this, and the sensor substrate 20 may be produced individually from scratch. Although details will be described later, four magnetic sensing elements R1 to R4 and three magnetic layers 41 to 43 are formed on the element forming surface 21. Further, four bonding pads 51 to 54 are provided on the element forming surface 21, which are connected to bonding pads 61 to 64 provided on the circuit board 10 through corresponding bonding wires BW.

The second and third external magnetic members 32 and 33 are disposed respectively on both sides of the sensor substrate 20 in the x-direction. The second and third external magnetic members 32 and 33 are connected to each other through the fourth external magnetic member 34 positioned at the bottom of the sensor substrate 20. Thus, the second to fourth external magnetic members 32 to 34 constitute a single magnetic block 35. The magnetic block 35 is disposed so as to be inserted into the opening 11 of the circuit board 10. The magnetic block 35 has a recessed part 36 for housing the sensor substrate 20. In a state where the sensor substrate 20 is housed in the recessed part 36, the element forming surface 21 of the sensor substrate 20 and leading ends of the respective second and third external magnetic members 32 and 33 are close to each other to constitute substantially the same plane.

Next, the components formed on the element forming surface 21 of the sensor substrate 20 will be described in detail.

Figure 4:
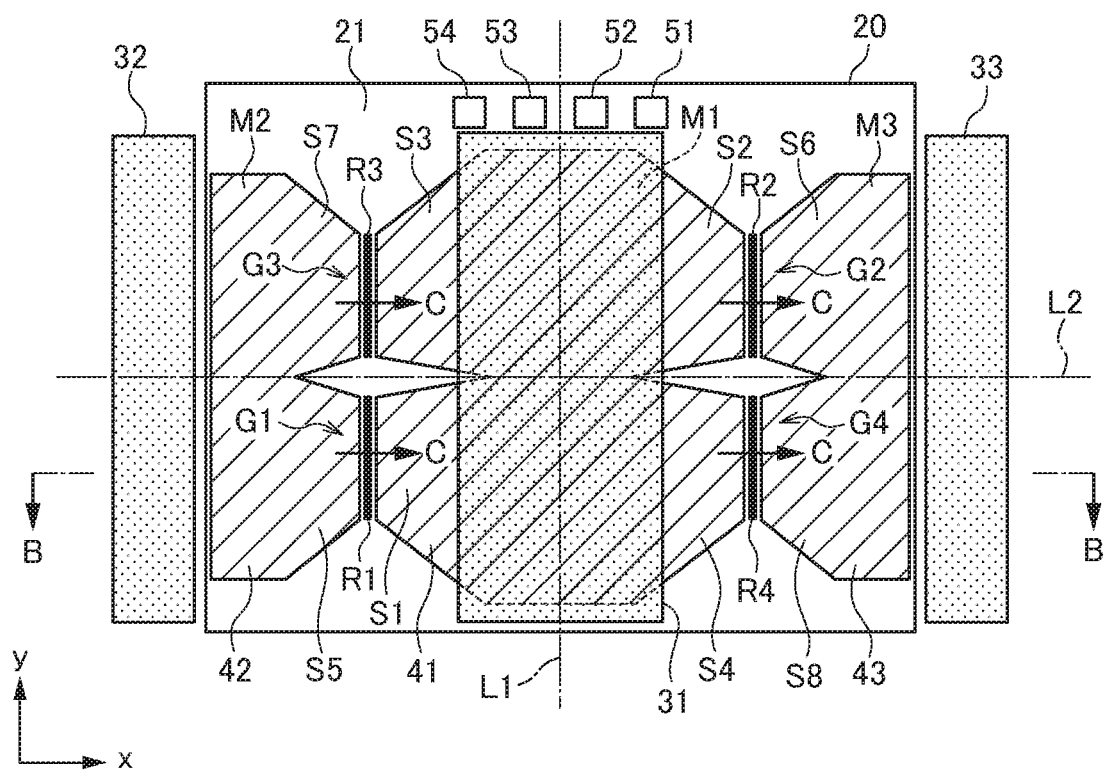
FIG. 4 is a schematic plan view for explaining the structure of the element forming surface 21 of the sensor substrate 20.
Figure 5:
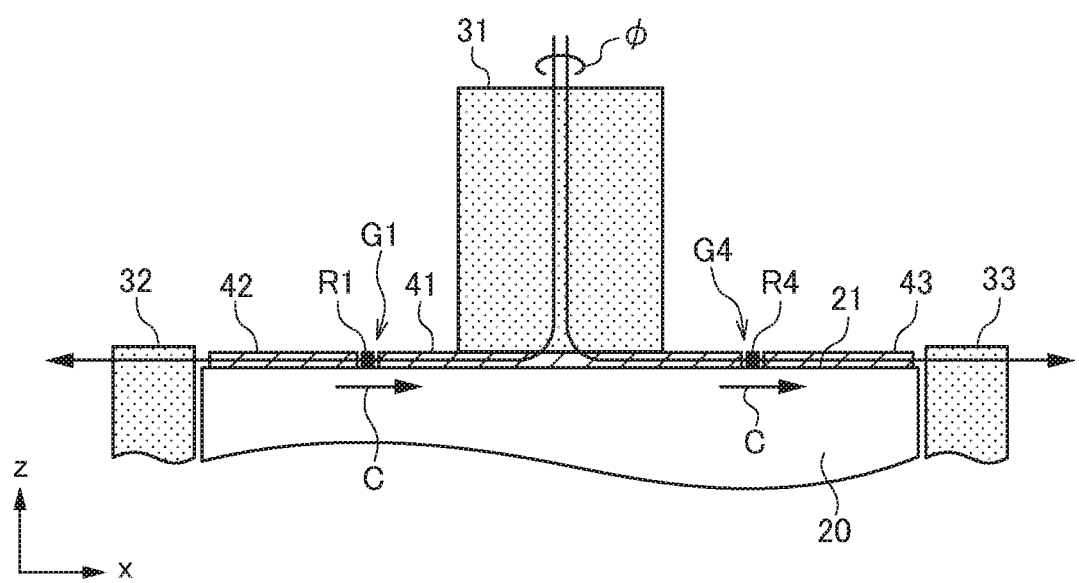
FIG. 5 is a schematic cross-sectional view taken along line B-B in FIG. 4.

FIG. 4 is a schematic plan view for explaining the structure of the element forming surface 21 of the sensor substrate 20. FIG. 5 is a schematic cross-sectional view taken along line B-B in FIG. 4.

As illustrated in FIGS. 4 and 5, first to third magnetic layers 41 to 43 are formed on the element forming surface 21 of the sensor substrate 20. The first magnetic layer 41 is positioned at substantially the center of the element forming surface 21, and the second and third magnetic layers 42 and 43 are disposed respectively on both sides of the first magnetic layer 41 in the x-direction. Although not particularly limited, the magnetic layers 41 to 43 may each be a film made of a composite magnetic material in which magnetic filler is dispersed in a resin material, may each be a thin film or foil made of a soft magnetic material such as nickel or permalloy, or may each be a thin film or bulk sheet made of ferrite.

The first magnetic layer 41 includes a first main area M1 positioned at the center thereof and first to fourth converging areas S1 to S4 each having a width in the y-direction gradually reduced with increasing distance from the first main area M1 in the x-direction. The first main area M1 is a part that is covered with the first external magnetic member 31. Although not particularly limited, the width of the first external magnetic member 31 in the y-direction is preferably larger than the width of the first main area M1 in the y-direction, whereby the entire width of the first main area M1 in the y-direction is preferably covered with the first external magnetic member 31. Thus, even when displacement occurs in the positional relationship between the first external magnetic member 31 and the first external magnetic member 31 during manufacture, detection accuracy is not significantly deteriorated. The displacement mentioned above can include rotational displacement as well as displacement in the xy direction.

As described above, the first to fourth converging areas S1 to S4 are each a taper-shaped portion having a width in the y-direction gradually reduced with increasing distance from the first main area M1 in the x-direction and, in the present embodiment, the first and third converging areas S1 and S3 are positioned on the negative x-direction side (left side) with respect to the first main area M1, and the second and fourth converging areas S2 and S4 are positioned on the positive x-direction side (right side) with respect to the first main area M1.

Figure 6:
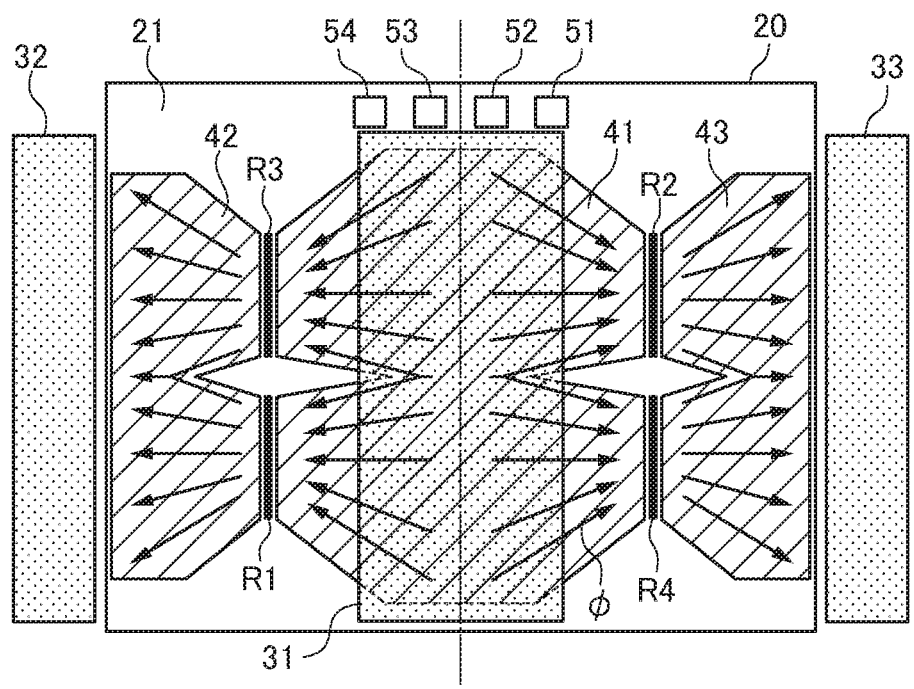
FIG. 6 is a diagram for explaining a state that the magnetic flux φ is evenly distributed.

The first magnetic layer 41 has a dyad-symmetric shape. Thus, the first converging area S1 and the fourth converging area S4 are line-symmetric with respect to a virtual line L1 extending in the y-direction and, similarly, the second converging area S2 and the third converging area S3 are line-symmetric with respect to the virtual line L1. Further, the first converging area S1 and the third converging area S3 are line-symmetric with respect to a virtual line L2 extending in the x-direction and, similarly, the second converging area S4 and the fourth converging area S4 are line-symmetric with respect to the virtual line L2. Thus, when magnetic flux taken in through the first external magnetic member 31 enters the first main area M1, the magnetic flux $\phi$ is substantially evenly distributed to the first to fourth converging areas S1 to S4 as illustrated in FIG. 6. The distributed magnetic flux $\phi$ passes the taper-shaped first to fourth converging areas S1 to S4 and thereby the magnetic flux density is increased.

The second magnetic layer 42 includes a second main area M2 and fifth and seventh converging areas S5 and S7 each having a width in the y-direction gradually reduced with increasing distance from the second main area M2 in the x-direction (positive side). Similarly, the third magnetic layer 43 includes a third main area M3 and sixth and eighth converging areas S6 and S8 each having a width in the y-direction gradually reduced with increasing distance from the third main area M3 in the x-direction (negative side). The second main area M2 is positioned near the end portion of the sensor substrate 20 on the negative x-direction side and is thus close to the second external magnetic member 32. The third main area M3 is positioned near the end portion of the sensor substrate 20 on the positive x-direction side and is thus close to the third external magnetic member 33.

The leading end portion of the fifth converging area S5 faces the leading end portion of the first converging area S1 through a first gap G1. The leading end portion of the seventh converging area S7 faces the leading end portion of the third converging area S3 through a third gap G3. The fifth converging area S5 and the seventh converging area S7 are line-symmetric with respect to the virtual line L2 extending in the x-direction. Thus, when magnetic flux taken in through the second external magnetic member 32 enters the second main area M2, the magnetic flux is substantially evenly distributed to the fifth and seventh converging areas S5 and S7.

The leading end portion of the sixth converging area S6 faces the leading end portion of the second converging area S2 through a second gap G2. The leading end portion of the eighth converging area S8 faces the leading end portion of the fourth converging area S4 through a fourth gap G4. The sixth converging area S6 and the eighth converging area S8 are line-symmetric with respect to the virtual line L2 extending in the x-direction. Thus, when magnetic flux taken in through the third external magnetic member 33 enters the third main area M3, the magnetic flux is substantially evenly distributed to the sixth and eighth converging areas S6 and S8.

As illustrated in FIG. 4, first to fourth magnetic sensing elements R1 to R4 each extending in the y-direction are disposed in the first to fourth gaps G1 to G4, respectively. The widths of the first to fourth gaps G1 to G4 in the x-direction are equal to each other. The first to fourth magnetic sensing elements R1 to R4 do not contact the first to third magnetic layers 41 to 43.

The magnetic sensing elements R1 to R4 are not particularly limited in type as long as they are elements whose physical characteristics change according to magnetic flux density. More specifically, the magnetic sensing elements R1 to R4 are preferably magnetoresistive elements whose electrical resistance changes according to the direction of a magnetic field and, more preferably, spin valve type GMR elements. In the present embodiment, the sensitivity directions (fixed magnetization directions) of the magnetic sensing elements R1 to R4 are all set in the direction (positive x-direction) denoted by the arrow C of FIGS. 4 and 5.

As illustrated in FIG. 5, the first external magnetic member 31 plays a role of collecting magnetic flux $\phi$ in the z-direction and releasing the collected magnetic flux $\phi$ to the first main area M1 of the first magnetic layer 41. Although the height of the first external magnetic member 31 in the z-direction is not particularly limited, the selectivity of the magnetic flux in the z-direction can be enhanced by increasing the height thereof in the z-direction. However, when the height of the first external magnetic member 31 in the z-direction is too high, support for the first external magnetic member 31 may become unstable. Therefore, it is preferable to set the height of the first external magnetic member 31 in a range where stable support can be ensured.

The magnetic flux $\phi$ collected to the first main area M1 through the first external magnetic member 31 is substantially evenly distributed to the first to fourth converging areas S1 to S4 as illustrated in FIG. 6 and then released to the fifth to eighth converging areas S5 to S8 through the first to fourth magnetic sensing elements R1 to R4, respectively. As a result, magnetic fluxes in mutually opposite directions are given to the magnetic sensing elements R1, R3 and magnetic sensing elements R2, R4. As described above, the fixed magnetization directions of the magnetic sensing elements R1 to R4 are all set in the positive x-direction denoted by the arrow C, so that the magnetic sensing elements R1 to R4 have sensitivity to the x-direction component of the magnetic flux.

The magnetic flux reaching the fifth and seventh converging areas S5 and S7 are collected by the second external magnetic member 32 through the second main area M2. Similarly, the magnetic flux reaching the sixth and eighth converging areas S6 and S8 are collected by the third external magnetic member 33 through the third main area M3.

Figure 7:
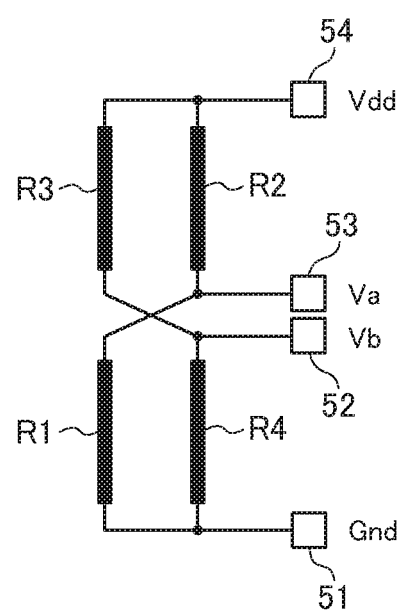
FIG. 7 is a circuit diagram for explaining a connection relationship between the magnetic sensing elements R1 to R4 and the bonding pads 51 to 54.

FIG. 7 is a circuit diagram for explaining a connection relationship between the magnetic sensing elements R1 to R4 and the bonding pads 51 to 54.

As illustrated in FIG. 7, a ground potential Gnd and a power supply potential Vdd are supplied from the circuit board 10 side to the bonding pads 51 and 54, respectively. Further, between the bonding pads 51 and 54, the magnetic sensing elements R1 and R2 are connected in series to each other, and the magnetic sensing elements R4 and R3 are connected in series to each other. A connection point between the magnetic sensing elements R3 and R4 is connected to the bonding pad 52, and a connection point between the magnetic sensing element R1 and R2 is connected to the bonding pad 53. With this bridge connection, it is possible to detect a change in the electrical resistances of the magnetic sensing elements R1 to R4 according to magnetic flux density with high sensitivity by referring to a potential Va appearing at the bonding pad 53 and a potential Vb appearing at the bonding pad 52.

Specifically, the magnetic sensing elements R1 to R4 have the same fixed magnetization direction, so that a difference occurs between the resistance variations of the magnetic sensing elements R1 and R3 positioned on one side as viewed from the first external magnetic member 31 and the resistance variations of the magnetic sensing elements R2 and R4 positioned on the other side as viewed from the first external magnetic member 31. This difference is amplified doubly by the differential bridge circuit of FIG. 7 and appears at the bonding pads 52 and 53. The circuit board 10 is mounted with a not-shown voltage detection circuit and detects a difference between the potentials Va and Vb appearing respectively at the bonding pads 52 and 53, whereby magnetic flux density can be measured.

The magnetic sensor 100 according to the present embodiment has the first to third magnetic layers 41 to 43 on the element forming surface 21 of the sensor substrate 20, and the magnetic sensing elements R1 to R4 are disposed respectively in the four gaps G1 to G4 formed by the magnetic layers 41 to 43, preventing magnetic flux generated by current flowing in one magnetic sensing element from affecting the other sensing element. Thus, it is possible to achieve higher detection accuracy than heretofore.

In addition, the eight converging areas S1 to S8 constituting the gaps G1 to G4 have the taper-shape having a width in the y-direction gradually reduced toward their corresponding magnetic sensing elements R1 to R4, so that the density of the magnetic flux to be given to the magnetic sensing elements R1 to R4 is increased. Further, the first main area M1 included in the first magnetic layer 41 has an area wide enough to be connected with the base portions of all the four converging areas S1 to S4, so that magnetism collection effect of the magnetic flux $\phi$ through the first external magnetic member 31 is improved, whereby high detection accuracy can be achieved.

Further, the magnetic sensor 100 according to the present embodiment has the first external magnetic member 31 and can thus selectively detect magnetic flux in the z-direction. In addition, in the magnetic sensor 100 according to the present embodiment, the second and third external magnetic members 32 and 33 are integrated, thereby allowing reduction in the magnetic resistance of the magnetic flux intruding to the back of the sensor substrate 20.

Hereinafter, some modifications of the magnetic sensor 100 according to the present embodiment will be described.

Figure 8:
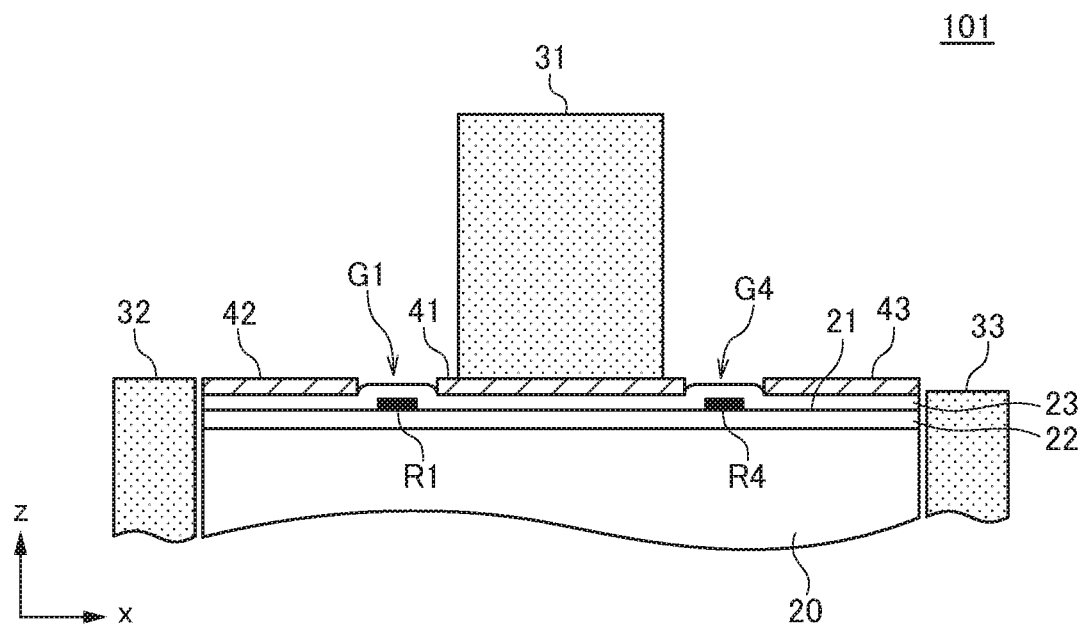
FIG. 8 is a schematic cross-sectional view for explaining the configuration of the main part of a magnetic sensor 101 according to a first modification.

FIG. 8 is a schematic cross-sectional view for explaining the configuration of the main part of a magnetic sensor 101 according to a first modification. In the example of FIG. 8, insulating layers 22 and 23 are laminated in this order on the surface of the sensor substrate 20, and the surface of the insulating layer 22 constitutes the element forming surface 21. The magnetic sensing elements R1 to R4 are provided on the surface of the insulating layer 22 serving as the element forming surface 21, and the magnetic layers 41 to 43 are provided on the surface of the insulating layer 23 positioned in the upper layer. Thus, in the magnetic sensor 101 according to the first modification, the magnetic sensing elements R1 to R4 and the magnetic layers 41 to 43 are positioned in mutually different layers, the magnetic sensing element R1 (R3) is disposed at a position overlapping the gap G1 (G3) formed by the magnetic layers 41 and 42 in a plan view, and the magnetic sensing element R4 (R2) is disposed at a position overlapping the gap G4 (G2) formed by the magnetic layers 41 and 43 in a plan view. As exemplified by the magnetic sensor 101 according to the first modification, in the present invention, the z-position of the magnetic sensing elements R1 to R4 and that of the magnetic layers 41 to 43 may differ mutually. In this case, the magnetic sensing elements R1 to R4 are not strictly positioned in the gaps G1 to G4, respectively; however, they are disposed on the magnetic paths formed respectively by the gaps G1 to G4, so that the magnetic flux passing the gaps G1 to G4 can be properly detected.

Figure 9:
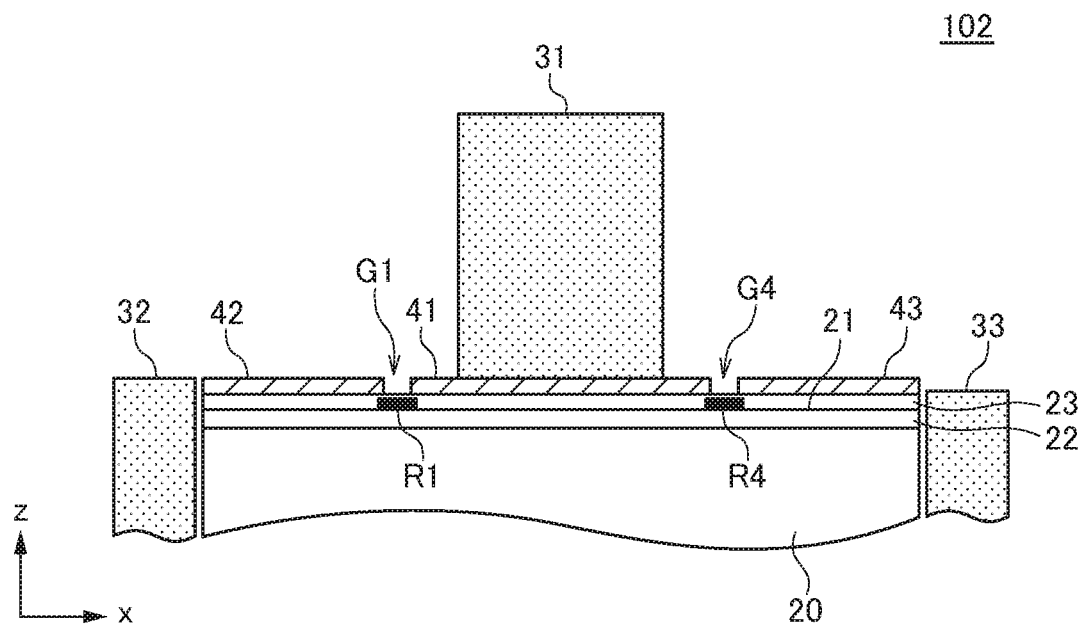
FIG. 9 is a schematic cross-sectional view for explaining the configuration of the main part of a magnetic sensor 102 according to a second modification.

FIG. 9 is a schematic cross-sectional view for explaining the configuration of the main part of a magnetic sensor 102 according to a second modification. In the example of FIG. 9, the magnetic sensing element R1 (R3) partially overlaps the magnetic layers 41 and 42 in the z-direction, and the magnetic sensing element R4 (R2) partially overlaps the magnetic layers 41 and 43 in the z-direction. In the present modification as well, the magnetic sensing elements R1 to R4 are not strictly positioned in the gaps G1 to G4, respectively; however, they are disposed on the magnetic paths formed respectively by the gaps G1 to G4. When the z-position of the magnetic sensing elements R1 to R4 and that of the magnetic layers 41 to 43 may thus differ mutually, leakage magnetic flux can be reduced by making the magnetic sensing element and magnetic layer partially overlap each other in the z-direction near the gap, whereby higher detection accuracy can be achieved.

Figure 10:
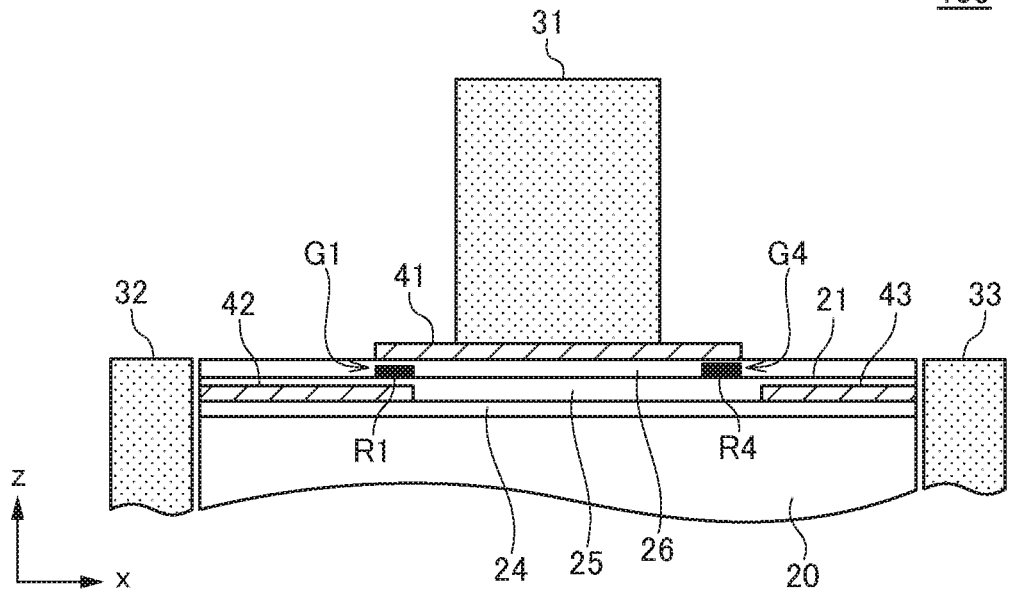
FIG. 10 is a schematic cross-sectional view for explaining the configuration of the main part of a magnetic sensor 103 according to a third modification.

FIG. 10 is a schematic cross-sectional view for explaining the configuration of the main part of a magnetic sensor 103 according to a third modification. In the example of FIG. 10, insulating layers 24, 25, and 26 are laminated in this order on the surface of the sensor substrate 20, and the surface of the insulating layer 25 constitutes the element forming surface 21. The magnetic sensing elements R1 to R4 are provided on the surface of the insulating layer 25 serving as the element forming surface 21, the magnetic layers 42 and 43 are provided on the surface of the insulating layer 24 positioned in the lower layer, and the magnetic layer 41 is provided on the surface of the insulating layer 26 positioned in the upper layer. Thus, in the magnetic sensor 103 according to the third modification, the magnetic layer 41 and magnetic layers 42 and 43 are positioned in mutually different layers, and they partially overlap each other to form three-dimensional gaps G1 to G4. The magnetic sensing elements R1 to R4 are disposed in the thus formed gaps G1 to G4, respectively. As exemplified by the magnetic sensor 103 according to the third modification, the gaps G1 to G4 may not necessarily be formed two-dimensionally and may be formed three-dimensionally.

Figure 11:
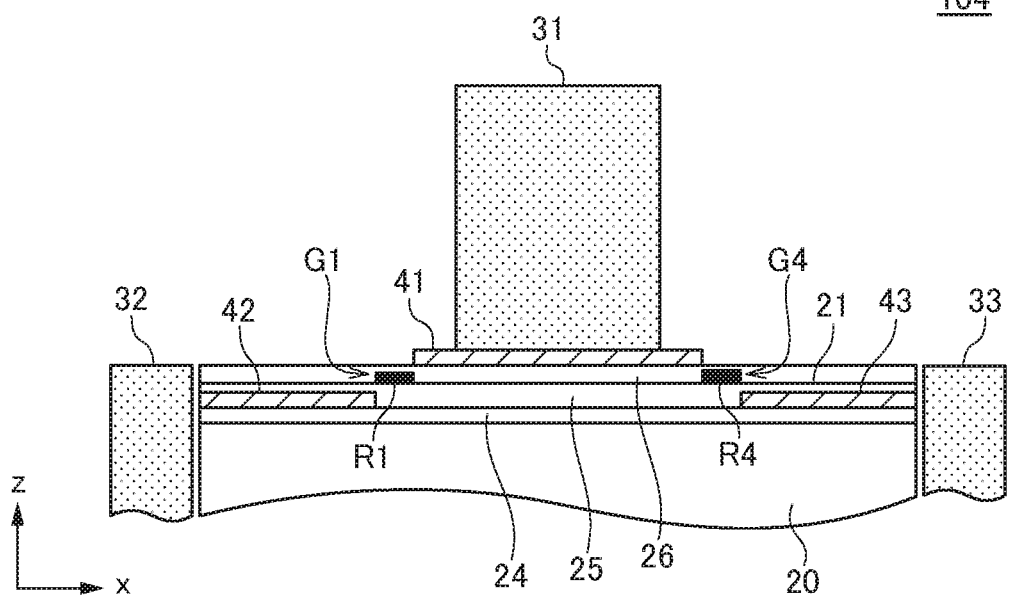
FIG. 11 is a schematic cross-sectional view for explaining the configuration of the main part of a magnetic sensor 104 according to a fourth modification.

FIG. 11 is a schematic cross-sectional view for explaining the configuration of the main part of a magnetic sensor 104 according to a fourth modification. In the example of FIG. 11, the magnetic layer 41 and magnetic layers 42 and 43 are positioned in mutually different layers and do not overlap each other. Thus, the gaps G1 to G4 are formed in the oblique direction by the magnetic layer 41 and magnetic layers 42 and 43, and the magnetic sensing elements R1 to R4 are disposed at locations corresponding to the gaps G1 to G4, respectively. In this case, the magnetic sensing elements R1 to R4 and magnetic layers 41 to 43 may or may not overlap each other.

Figure 12:
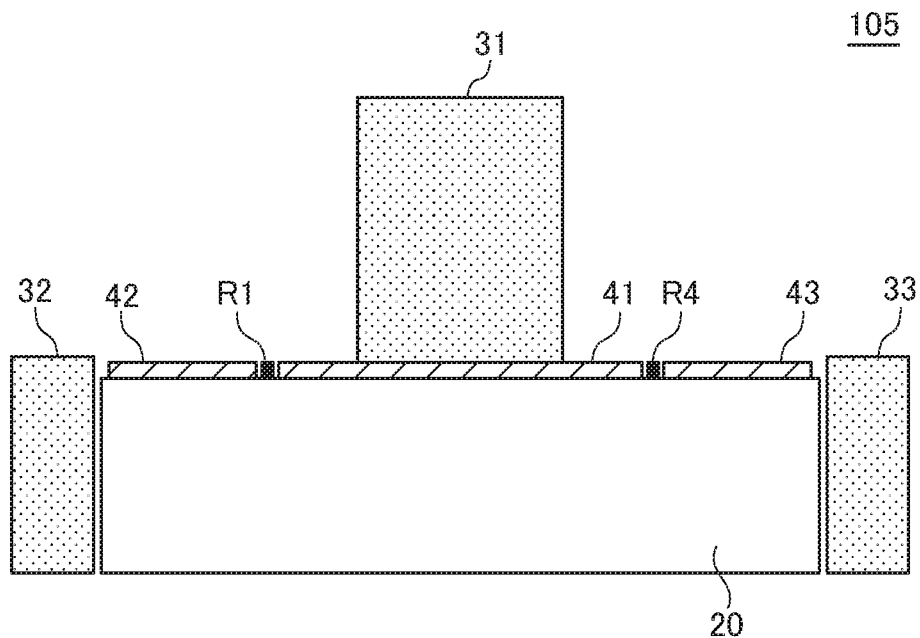
FIG. 12 is a schematic cross-sectional view for explaining the configuration of the main part of a magnetic sensor 105 according to a fifth modification.

FIG. 12 is a schematic cross-sectional view for explaining the configuration of the main part of a magnetic sensor 105 according to a fifth modification. In the example of FIG. 12, the second external magnetic member 32 and third external magnetic member 33 are not integrated but separated from each other. Although the magnetic resistance of the magnetic flux intruding to the back of the sensor substrate 20 is slightly increased in such a configuration, substantially the same effects as those in the above-described magnetic sensor 100 can be obtained.

Figure 13:
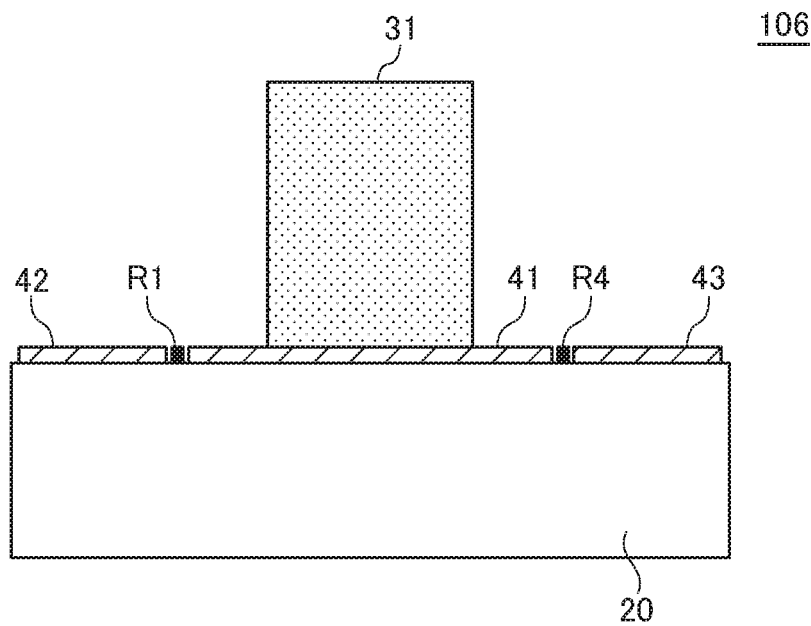
FIG. 13 is a schematic cross-sectional view for explaining the configuration of the main part of a magnetic sensor 106 according to a sixth modification.

FIG. 13 is a schematic cross-sectional view for explaining the configuration of the main part of a magnetic sensor 106 according to a sixth modification. In the example of FIG. 13, the second and third external magnetic members 32 and 33 are omitted. Although magnetism collection effect by the second and third external magnetic members 32 and 33 is lost in such a configuration, substantially the same effects as those in the above-described magnetic sensor 100 can be obtained.

Figure 14:
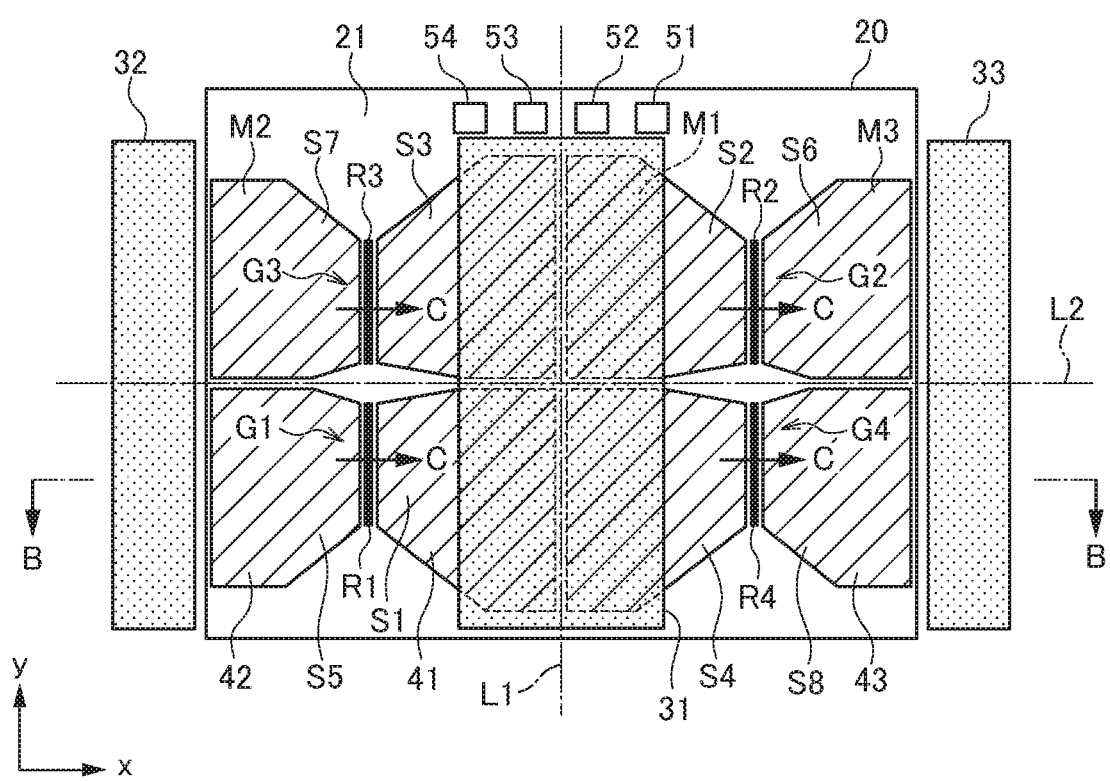
FIG. 14 is a schematic plan view for explaining the configuration of the main part of a magnetic sensor 107 according to a seventh modification.

FIG. 14 is a schematic plan view for explaining the configuration of the main part of a magnetic sensor 107 according to a seventh modification. In the example of FIG. 14, a slit is formed in each of the magnetic layers 41 to 43, and the magnetic layers 41 to 43 are each divided by the slit into a plurality of parts. Specifically, a cross-shaped slit is formed in the magnetic layer 41, whereby the first to fourth converging areas S1 to S4 are separated from each other. Further, a slit extending in the x-direction is formed in each of the magnetic layers 42 and 43, whereby the fifth and seventh converging areas S5 and S7 are separated from each other, and the sixth and eighth converging areas S6 and S8 are separated from each other. Although such slits serve as a magnetic gap, detection accuracy can be sufficiently ensured as long as the width of the slits is small enough. As exemplified by the magnetic sensor 107 according to the seventh modification, in the present invention, each of the magnetic layers 41 to 43 may not necessarily be formed completely integrally.

Figure 15:
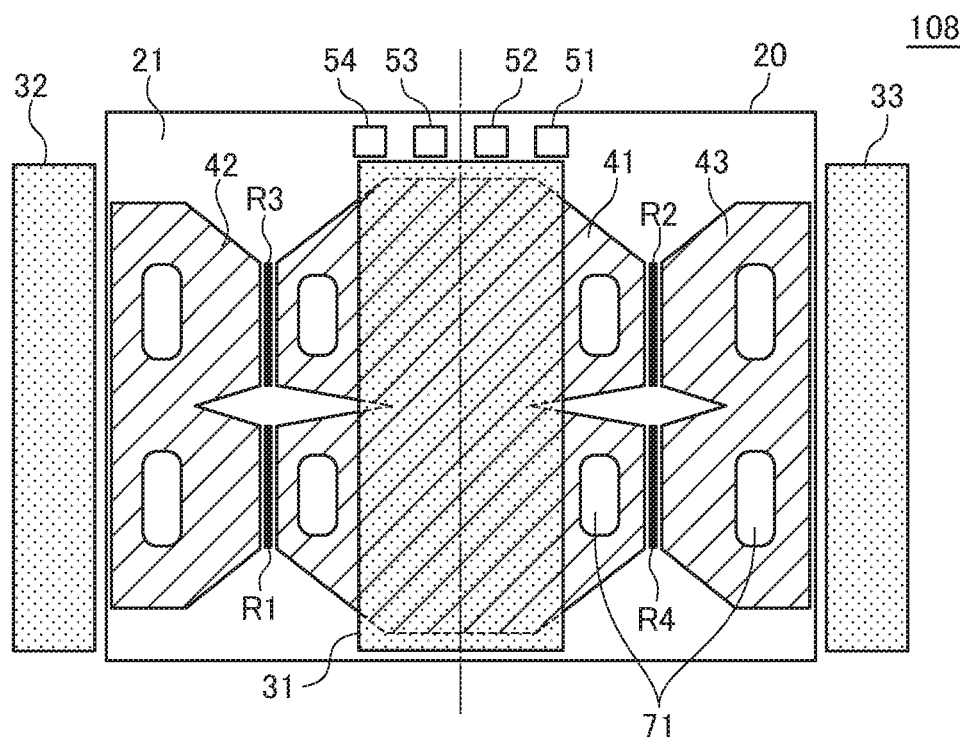
FIG. 15 is a schematic plan view for explaining the configuration of the main part of a magnetic sensor 108 according to an eighth modification.

FIG. 15 is a schematic plan view for explaining the configuration of the main part of a magnetic sensor 108 according to an eighth modification. In the example of FIG. 15, cut parts 71 are formed in each of the first to third magnetic layers 41 to 43. The cut parts 71 are each an independent space pattern having a loop-shaped outer periphery. The cut parts 71 each have an elliptical shape with the Y-axis being the long axis. The independent space pattern indicates that the outer periphery is closed. In the example of FIG. 15, four cut parts 71 are formed in the first magnetic layer 41, and two cut parts 71 are formed in each of the second and third magnetic layers 42 and 43. In the first magnetic layer 41, the cut parts 71 are disposed avoiding the first main area M1, thereby preventing deterioration in magnetism collection effect in the first main area M1. When such cut parts 71 are formed, residual magnetic flux of the first to third magnetic layers 41 to 43 circulates around the outer periphery of each cut part 71, thus making it possible to prevent deterioration in detection accuracy attributable to the residual magnetic flux.

Figure 16:
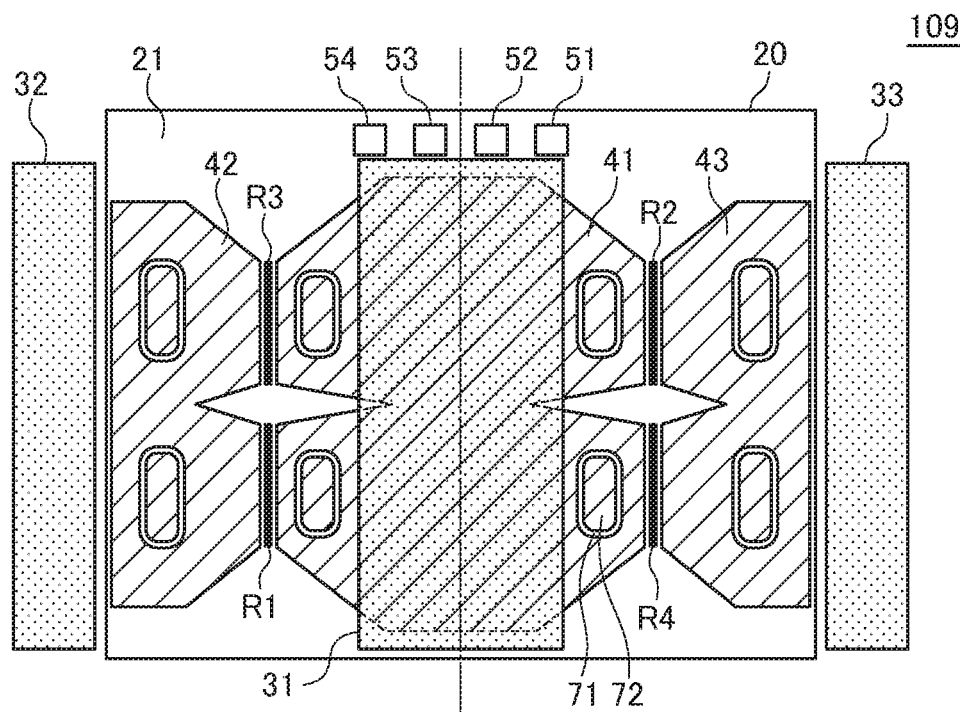
FIG. 16 is a schematic plan view for explaining the configuration of the main part of a magnetic sensor 109 according to a ninth modification.

FIG. 16 is a schematic plan view for explaining the configuration of the main part of a magnetic sensor 109 according to a ninth modification. The example of FIG. 16 differs from the example of FIG. 15 in that an island-shaped independent pattern 72 is provided in the inner diameter area of the cut part 71. The independent pattern 72 is separated from each of the first to third magnetic layers 41 to 43 with the cut part 71 interposed therebetween. By adding such an independent pattern 72, it is possible to minimize an increase in magnetic resistance due to the formation of the cut parts 71.

Figure 17:
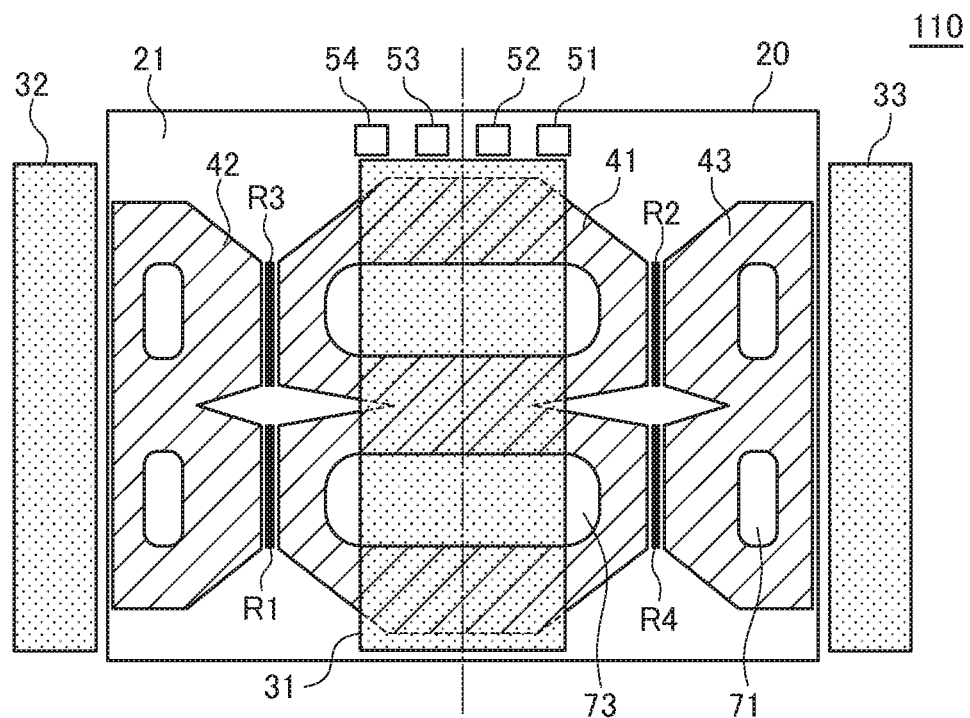
FIG. 17 is a schematic plan view for explaining the configuration of the main part of a magnetic sensor 110 according to a tenth modification.

FIG. 17 is a schematic plan view for explaining the configuration of the main part of a magnetic sensor 110 according to a tenth modification. The example of FIG. 17 differs from the example of FIG. 15 in that two cut parts 73 are formed in the first magnetic layer 41. The cut parts 73 are also each an independent space pattern having a loop-shaped outer periphery and each have an elliptical shape with the Y-axis being the long axis. Even with such a configuration, the same effects as those in the example of FIG. 15 can be obtained.

Figure 18:
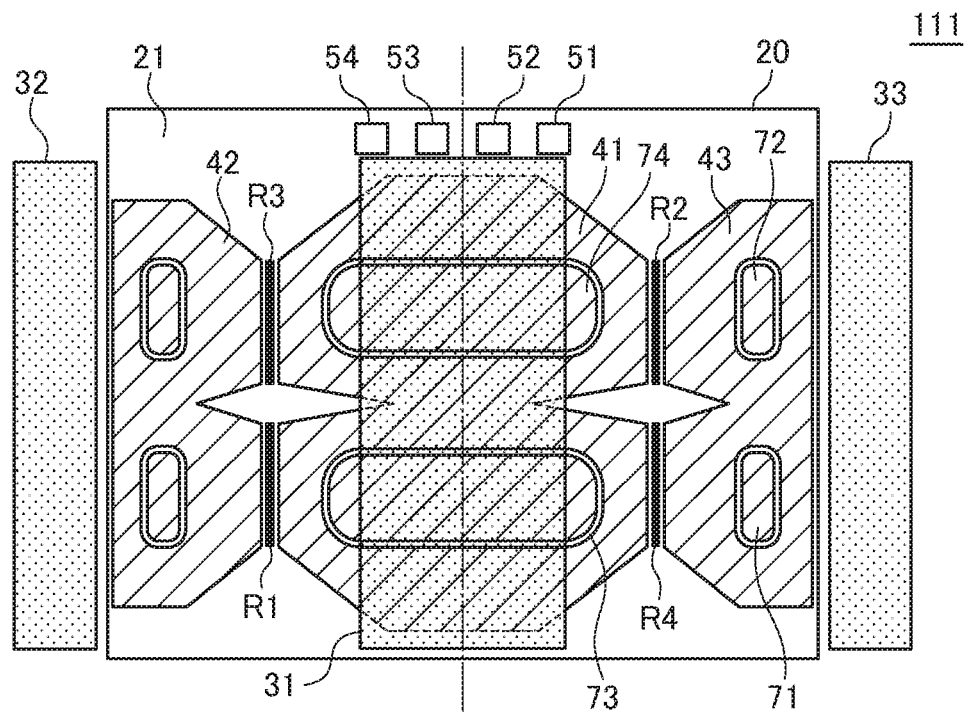
FIG. 18 is a schematic plan view for explaining the configuration of the main part of a magnetic sensor 111 according to an eleventh modification.

FIG. 18 is a schematic plan view for explaining the configuration of the main part of a magnetic sensor 111 according to an eleventh modification. The example of FIG. 18 differs from the example of FIG. 17 in that an island-shaped independent pattern 74 is provided in the inner diameter area of the cut part 73. The independent pattern 74 is separated from the first magnetic layer 41 with the cut part 73 interposed therebetween. By adding such an independent pattern 74, it is possible to minimize an increase in magnetic resistance due to the formation of the cut parts 73.

Figure 19:
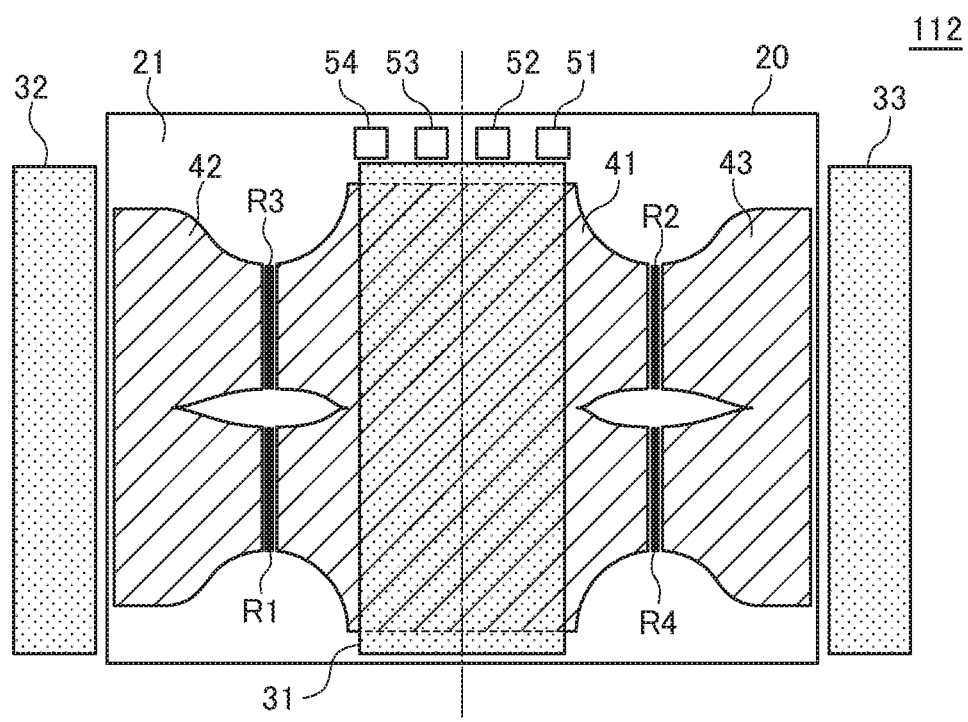
FIG. 19 is a schematic plan view for explaining the configuration of the main part of a magnetic sensor 112 according to a twelfth modification.

FIG. 19 is a schematic plan view for explaining the configuration of the main part of a magnetic sensor 112 according to a twelfth modification. In the example of FIG. 19, each of the first to eighth converging areas S1 to S8 has a curved edge. This makes the flow of magnetic flux in the first to eighth converging areas S1 to S8 smoother, reducing magnetic resistance.

Figure 20:
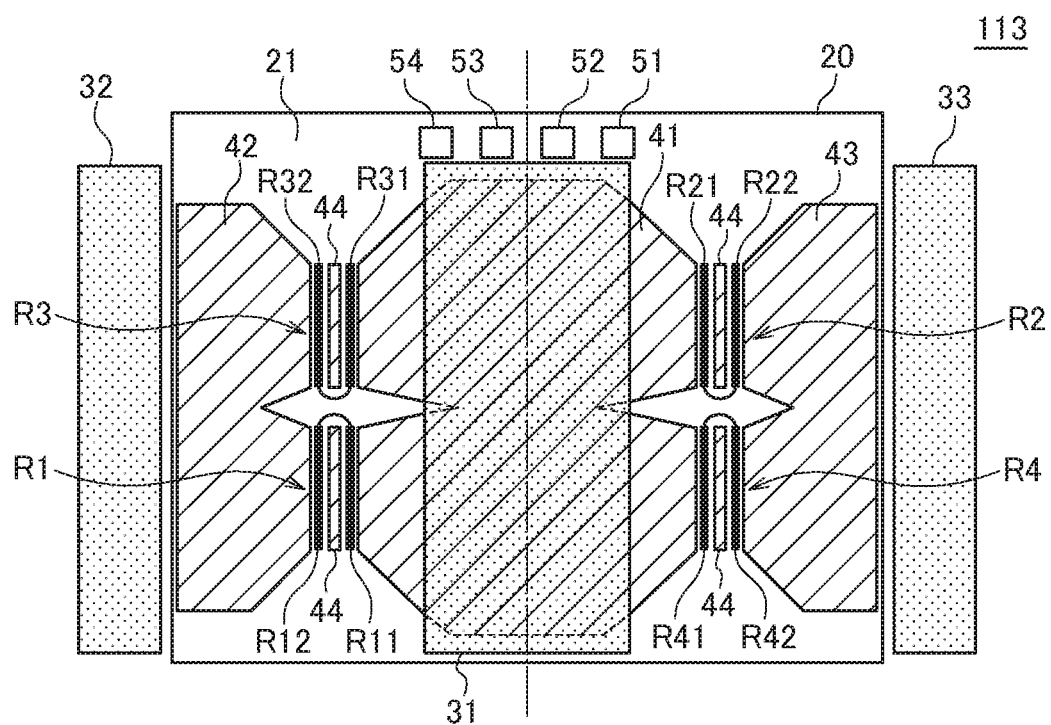
FIG. 20 is a schematic plan view for explaining the configuration of the main part of a magnetic sensor 108 according to an eighth modification.

FIG. 20 is a schematic plan view for explaining the configuration of the main part of a magnetic sensor 113 according to a thirteenth modification. In the example of FIG. 20, two magnetic sensing elements are provided in each of the gaps G1 to G4 to constitute each of the first to fourth magnetic sensing elements R1 to R4. Specifically, the first magnetic sensing element R1 is constituted by two series-connected magnetic sensing elements R11 and R12, the second magnetic sensing element R2 is constituted by two series-connected magnetic sensing elements R21 and R22, the third magnetic sensing element R3 is constituted by two series-connected magnetic sensing elements R31 and R32, and the fourth magnetic sensing element R4 is constituted by two series-connected magnetic sensing elements R41 and R42. With this configuration, higher magnetoresistive effect can be obtained, so that it is possible to achieve high detection accuracy substantially without increasing the size of the sensor substrate 20. A fourth magnetic layer 44 may be additionally provided between the two series-connected magnetic sensing elements (e.g., between R11 and R12). Further, each of the first to fourth magnetic sensing elements R1 to R4 may be constituted by three or more series-connected magnetic sensing elements.

Figure 21:
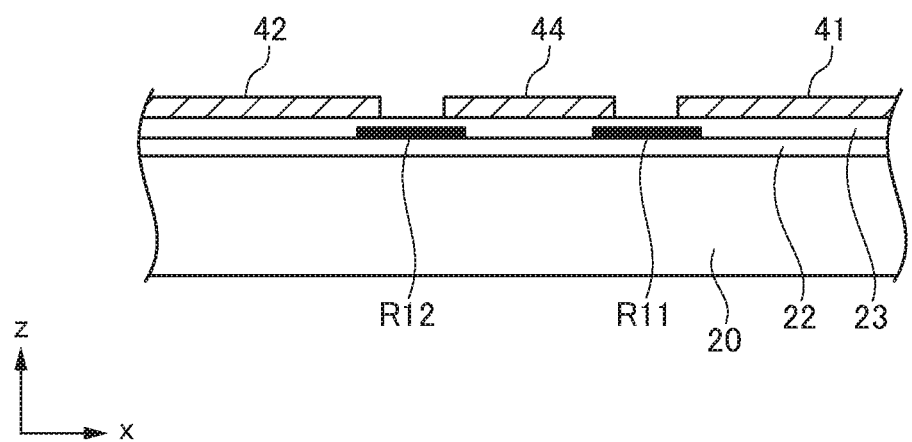
FIG. 21 is a schematic cross-sectional view for explaining the configuration of the main part of a magnetic sensor 114 according to a fourteenth modification.

FIG. 21 is a schematic cross-sectional view for explaining the configuration of the main part of a magnetic sensor 114 according to a fourteenth modification. In the example of FIG. 21, the magnetic sensing element R1 is constituted by two magnetic sensing elements R11 and R12, the magnetic sensing element R11 partially overlaps the magnetic layers 41 and 44, and the magnetic sensing element R12 partially overlaps the magnetic layers 42 and 44. Other not-shown magnetic sensing elements R2 to R4 have the same configuration. By additionally providing the fourth magnetic layer 44 and making the magnetic sensing elements R1 to R4 and magnetic layers 41 to 44 overlap each other, leakage magnetic flux is reduced to make it possible to achieve higher detection accuracy.

Figure 22:
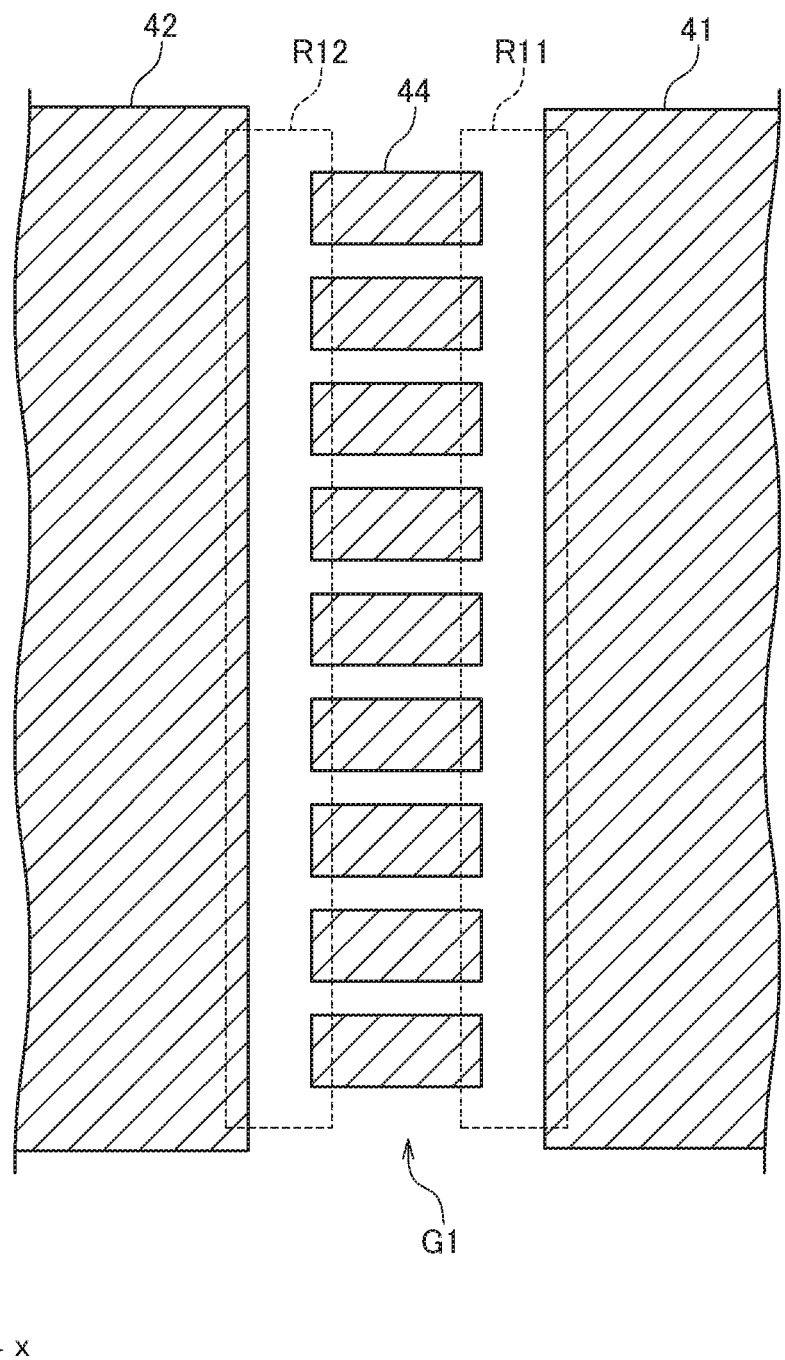
FIG. 22 is a schematic plan view for explaining the configuration of the main part of a magnetic sensor 115 according to a fifteenth modification.

FIG. 22 is a schematic plan view for explaining the configuration of the main part of a magnetic sensor 115 according to a fifteenth modification. In the example of FIG. 22, the fourth magnetic layer 44 is divided into a plurality of parts in the y-direction that is the extending direction of the gap G1. The fourth magnetic layers 44 on not-shown other respective gaps G2 to G4 have the same configuration. By thus dividing the fourth magnetic layer 44 in the y-direction, the flow of magnetic flux passing the gaps G1 to G4 is restricted to the x-direction that is the magnetism sensing direction, with the result that magnetic flux hardly flows in the y-direction. That is, by dividing the fourth magnetic layer 44 in the y-direction, magnetic anisotropy occurs, allowing achievement of higher detection accuracy.

Figure 23:
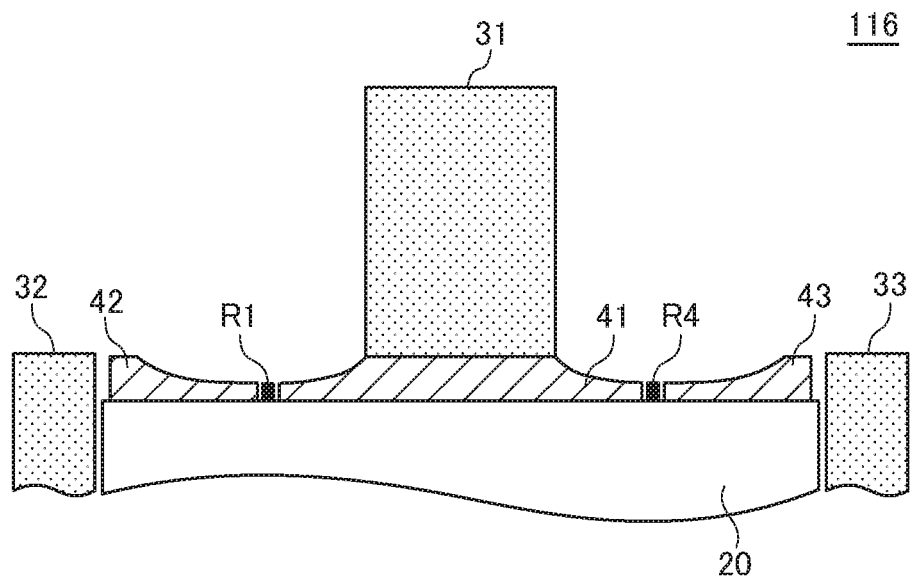
FIG. 23 is a schematic cross-sectional view for explaining the configuration of the main part of a magnetic sensor 116 according to a sixteenth modification.

FIG. 23 is a schematic cross-sectional view for explaining the configuration of the main part of a magnetic sensor 116 according to a sixteenth modification. In the example of FIG. 23, the film thickness of the first to third magnetic layers 41 to 43 is continuously reduced toward the gaps G1 to G4. With this configuration, magnetic flux is concentrated more on the first to fourth magnetic sensing elements R1 to R4, making it possible to enhance detection accuracy.

Figure 24:
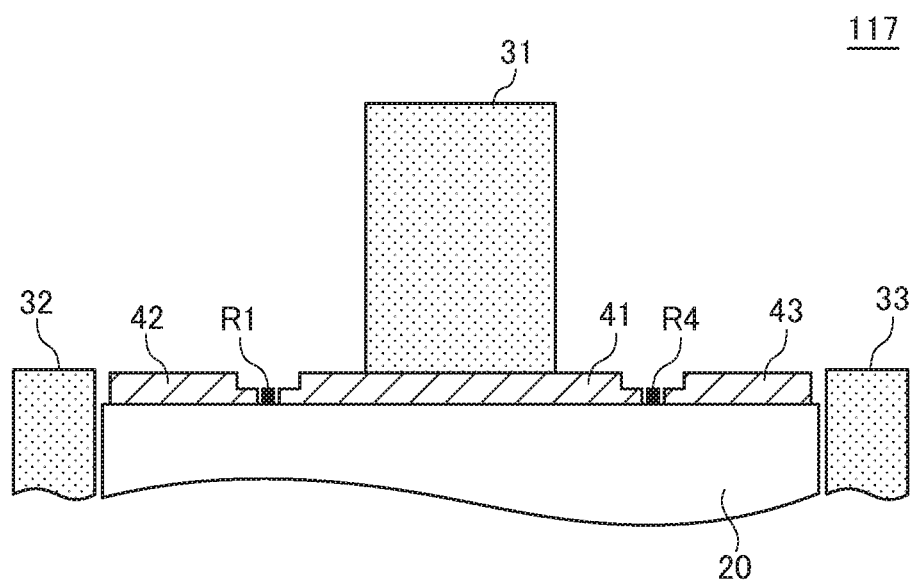
FIG. 24 is a schematic cross-sectional view for explaining the configuration of the main part of a magnetic sensor 117 according to a seventeenth modification.

FIG. 24 is a schematic cross-sectional view for explaining the configuration of the main part of a magnetic sensor 117 according to a seventeenth modification. In the example of FIG. 24, the film thickness of the first to third magnetic layers 41 to 43 is reduced stepwise near the gaps G1 to G4. Even with this configuration, magnetic flux is concentrated more on the first to fourth magnetic sensing elements R1 to R4, making it possible to enhance detection accuracy.

Figure 25:
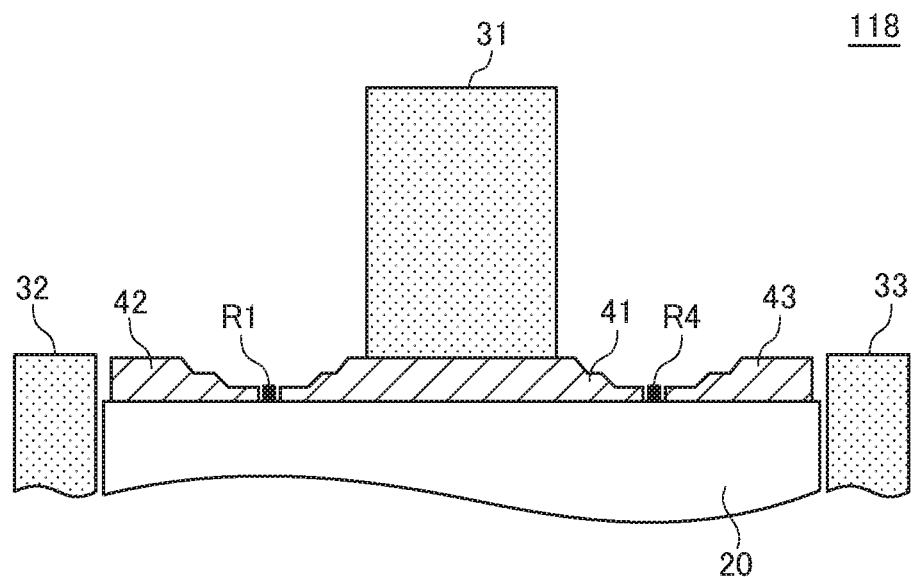
FIG. 25 is a schematic cross-sectional view for explaining the configuration of the main part of a magnetic sensor 118 according to an eighteenth modification.

FIG. 25 is a schematic cross-sectional view for explaining the configuration of the main part of a magnetic sensor 118 according to an eighteenth modification. In the example of FIG. 25, the film thickness of the first to third magnetic layers 41 to 43 is reduced in a stairway pattern toward the gaps G1 to G4. Even with this configuration, magnetic flux is concentrated more on the first to fourth magnetic sensing elements R1 to R4, making it possible to enhance detection accuracy.

Figure 26:
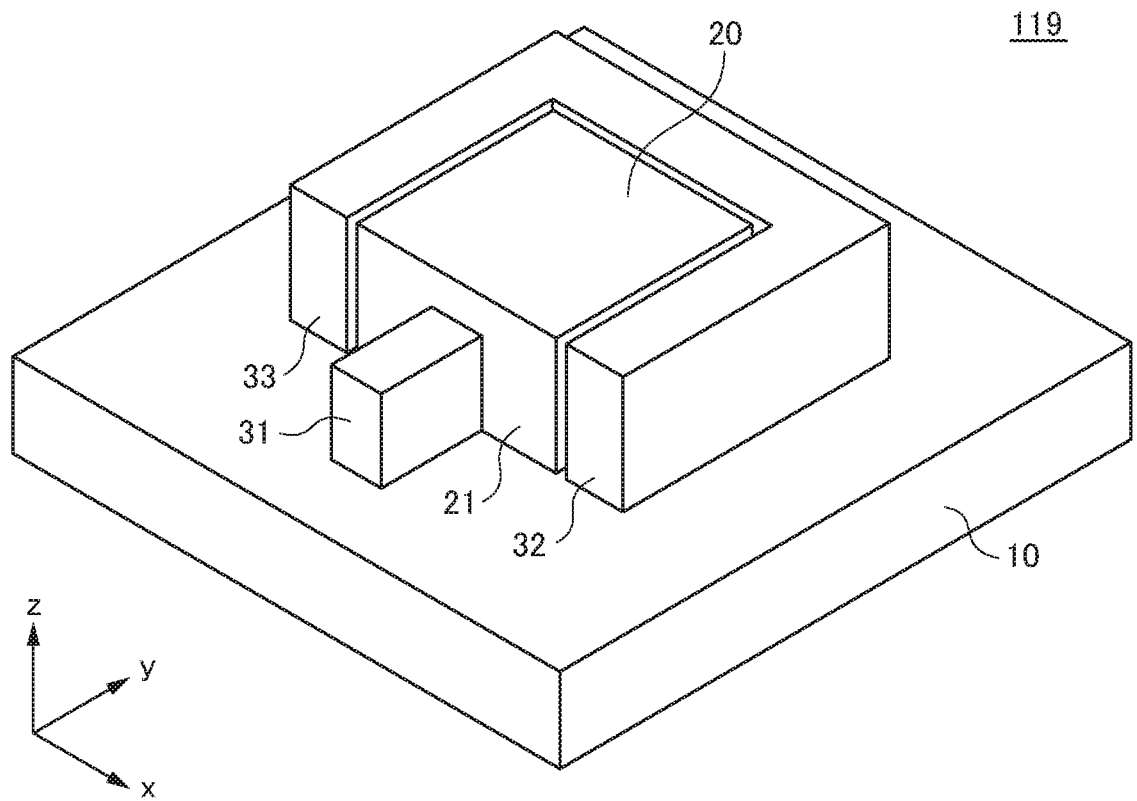
FIG. 26 is a schematic cross-sectional view for explaining the configuration of the main part of a magnetic sensor 119 according to a nineteenth modification.

FIG. 26 is a schematic cross-sectional view for explaining the configuration of the main part of a magnetic sensor 119 according to a nineteenth modification. In the example of FIG. 26, the sensor substrate 20 is mounted sideways on the surface (xy plane) of the circuit board 10. That is, the element forming surface 21 of the sensor substrate 20 constitutes the xz plane, and the first external magnetic member 31 extends in the y-direction. This configuration eliminates the need to form the opening 11 in the circuit board 10 and allows magnetic flux in a direction parallel to the main surface of the circuit board 10 to be selectively detected. Further, even when the height (length in the y-direction) of the first external magnetic member 31 is increased, support for the first external magnetic member 31 does not become unstable.

It is apparent that the present invention is not limited to the above embodiments, but may be modified and changed without departing from the scope and spirit of the invention.

REFERENCE SIGNS LIST 10 circuit board
11 opening
20 sensor substrate
21 element forming surface 22-26 insulating layer
31-34 external magnetic member
35 magnetic block
36 recessed part
41-44 magnetic layer
51-54, 61-64 bonding pad
71, 73 cut part
72, 74 independent pattern
100-119 magnetic sensor
BW bonding wire
G1-G4 gap
L1, L2 line
M1-M3 main area
R1-R4 magnetic sensing element
S1-S8 converging area
φ magnetic flux

What is claimed is:

1. A magnetic sensor comprising:
a sensor substrate;
first, second, and third magnetic layers provided on the sensor substrate, the first magnetic layer being arranged between the second and third magnetic layers, the first magnetic layer being greater in area than the second and third magnetic layers; and
first, second, third, and fourth magnetic sensing elements that are bridge-connected,
wherein the first magnetic layer includes a first main area and first, second, third, and fourth converging areas each having a width gradually reduced with increasing distance from the first main area,
wherein the second magnetic layer includes a second main area and fifth and seventh converging areas each having a width gradually reduced with increasing distance from the second main area,
wherein the third magnetic layer includes a third main area and sixth and eighth converging areas each having a width gradually reduced with increasing distance from the third main area,
wherein end portions of the first, second, third, and fourth converging areas and end portions of the fifth, sixth, seventh, and eighth converging areas face each other, respectively, through first, second, third, and fourth gaps, respectively, and
wherein the first, second, third, and fourth magnetic sensing elements are disposed on magnetic paths formed by the first, second, third, and fourth gaps, respectively.

2. The magnetic sensor as claimed in claim 1, further comprising a first external magnetic member provided on the sensor substrate so as to cover the first main area.

3. The magnetic sensor as claimed in claim 2, wherein a width of the first external magnetic member in a first direction that is an extending direction of the first to fourth gaps is larger than a width of the first main area in the first direction, whereby an entire width of the first main area in the first direction is covered with the first external magnetic member.

4. The magnetic sensor as claimed in claim 2, further comprising a second external magnetic member provided near the second main area and a third external magnetic member provided near the third main area.

5. The magnetic sensor as claimed in claim 1,
wherein the first converging area and the third converging area are line-symmetric with respect to a first line extending in a first direction that is an extending direction of the first to fourth gaps, and
the second converging area and the third converging area are line-symmetric with respect to the first line.

6. The magnetic sensor as claimed in claim 1,
wherein the first converging area and the third converging area are line-symmetric with respect to a second line extending in a second direction perpendicular to an extending direction of the first to fourth gaps,
wherein the second converging area and the fourth converging area are line-symmetric with respect to the second line,
wherein the fifth converging area and the seventh converging area are line-symmetric with respect to the second line, and
wherein the sixth converging area and the eighth converging area are line-symmetric with respect to the second line.

7. The magnetic sensor as claimed in claim 1,
wherein each of the first and third magnetic sensing elements overlaps the first and second magnetic layers, and
wherein each of the second and fourth magnetic sensing elements overlaps the first and third magnetic layers.

8. The magnetic sensor as claimed in claim 1, wherein a cut part having a loop-shaped outer periphery is formed in the first magnetic layer.

9. The magnetic sensor as claimed in claim 1, wherein each of the first, second, third, and fourth magnetic sensing elements is constituted by a plurality of series-connected magnetic sensing elements disposed on the magnetic path formed by each of the first, second, third, and fourth gaps.

10. The magnetic sensor as claimed in claim 9, further comprising fourth magnetic layers disposed, in a plan view, between the plurality of magnetic sensing elements constituting each of the first, second, third, and fourth sensing elements.

11. The magnetic sensor as claimed in claim 10, wherein the fourth magnetic layers overlap the plurality of magnetic sensing elements constituting each of the first, second, third, and fourth sensing elements.

12. The magnetic sensor as claimed in claim 10, wherein the fourth magnetic layers are divided in a first direction that is an extending direction of the first to fourth gaps.

13. The magnetic sensor as claimed in claim 1, wherein each of the first to fourth magnetic sensing elements is a magnetoresistive element.

14. The magnetic sensor as claimed in claim 13, wherein sensitivity directions of the magnetoresistive elements constituting the respective first to fourth magnetic sensing elements are the same.

15. The magnetic sensor as claimed in claim 13, wherein each of the magnetoresistive elements constituting the respective first to fourth magnetic sensing elements is a spin valve type GMR element.

16. The magnetic sensor as claimed in claim 1,
wherein the widths of the first and third converging areas in a first direction are gradually reduced from the first main area toward a second direction perpendicular with the first direction,
wherein the widths of the second and fourth converging areas in the first direction are gradually reduced from the first main area toward a third direction opposite to the second direction,
wherein the widths of the fifth and seventh converging areas in the first direction are gradually reduced from the second main area toward the third direction, and wherein the widths of the sixth and eighth converging areas in the first direction are gradually reduced from the third main area toward the second direction.

17. The magnetic sensor as claimed in claim 16, wherein the first, second, third, and fourth gaps are extending in the first direction.

18. A magnetic sensor comprising:
a sensor substrate;
first, second, and third magnetic layers provided on the sensor substrate; and
first, second, third, and fourth magnetic sensing elements that are bridge-connected,
wherein the first magnetic layer includes a first main area and first, second, third, and fourth converging areas each having a width gradually reduced with increasing distance from the first main area,
wherein the second magnetic layer includes a second main area and fifth and seventh converging areas each having a width gradually reduced with increasing distance from the second main area,
wherein the third magnetic layer includes a third main area and sixth and eighth converging areas each having a width gradually reduced with increasing distance from the third main area,
wherein end portions of the first, second, third, and fourth converging areas and end portions of the fifth, sixth, seventh, and eighth converging areas face each other, respectively, through first, second, third, and fourth gaps, respectively,
wherein the first, second, third, and fourth magnetic sensing elements are disposed on magnetic paths formed by the first, second, third, and fourth gaps, respectively,
wherein the magnetic sensor further comprises a first external magnetic member provided on the sensor substrate so as to cover the first main area, and
wherein a width of the first external magnetic member in a first direction that is an extending direction of the first to fourth gaps is larger than a width of the first main area in the first direction, whereby an entire width of the first main area in the first direction is covered with the first external magnetic member.

19. A magnetic sensor comprising:
a sensor substrate;
first, second, and third magnetic layers provided on the sensor substrate; and
first, second, third, and fourth magnetic sensing elements that are bridge-connected,
wherein the first magnetic layer includes a first main area and first, second, third, and fourth converging areas each having a width gradually reduced with increasing distance from the first main area,
wherein the second magnetic layer includes a second main area and fifth and seventh converging areas each having a width gradually reduced with increasing distance from the second main area,
wherein the third magnetic layer includes a third main area and sixth and eighth converging areas each having a width gradually reduced with increasing distance from the third main area,
wherein end portions of the first, second, third, and fourth converging areas and end portions of the fifth, sixth, seventh, and eighth converging areas face each other, respectively, through first, second, third, and fourth gaps, respectively,
wherein the first, second, third, and fourth magnetic sensing elements are disposed on magnetic paths formed by the first, second, third, and fourth gaps, respectively,
wherein the first converging area and the fourth converging area are line-symmetric with respect to a first line extending in a first direction that is an extending direction of the first to fourth gaps, and
wherein the second converging area and the third converging area are line-symmetric with respect to the first line.

20. A magnetic sensor comprising:
a sensor substrate;
first, second, and third magnetic layers provided on the sensor substrate; and
first, second, third, and fourth magnetic sensing elements that are bridge-connected,
wherein the first magnetic layer includes a first main area and first, second, third, and fourth converging areas each having a width gradually reduced with increasing distance from the first main area,
wherein the second magnetic layer includes a second main area and fifth and seventh converging areas each having a width gradually reduced with increasing distance from the second main area,
wherein the third magnetic layer includes a third main area and sixth and eighth converging areas each having a width gradually reduced with increasing distance from the third main area,
wherein end portions of the first, second, third, and fourth converging areas and end portions of the fifth, sixth, seventh, and eighth converging areas face each other, respectively, through first, second, third, and fourth gaps, respectively,
wherein the first, second, third, and fourth magnetic sensing elements are disposed on magnetic paths formed by the first, second, third, and fourth gaps, respectively,
wherein the first converging area and the third converging area are line-symmetric with respect to a second line extending in a second direction perpendicular to an extending direction of the first to fourth gaps,
wherein the second converging area and the fourth converging area are line-symmetric with respect to the second line,
wherein the fifth converging area and the seventh converging area are line-symmetric with respect to the second line, and
wherein the sixth converging area and the eighth converging area are line-symmetric with respect to the second line.

* * * * *